United States Patent
Leng et al.

(10) Patent No.: US 10,553,336 B2
(45) Date of Patent: Feb. 4, 2020

(54) THIN-FILM RESISTOR (TFR) MODULE WITH TOP-SIDE INTERCONNECTS CONNECTED TO REDUCED TFR RIDGES AND MANUFACTURING METHODS

(71) Applicant: Microchip Technology Incorporated, Chandler, AZ (US)

(72) Inventors: Yaojian Leng, Portland, OR (US); Justin Sato, West Linn, OR (US); Greg Stom, Rhododendron, OR (US)

(73) Assignee: MICROCHIP TECHNOLOGY INCORPORATED, Chandler, AZ (US)

( * ) Notice: Subject to any disclaimer, the term of this patent is extended or adjusted under 35 U.S.C. 154(b) by 21 days.

(21) Appl. No.: 16/034,423

(22) Filed: Jul. 13, 2018

(65) Prior Publication Data
US 2019/0392967 A1   Dec. 26, 2019

Related U.S. Application Data

(60) Provisional application No. 62/688,132, filed on Jun. 21, 2018.

(51) Int. Cl.
*H01C 17/07*  (2006.01)
*H01C 17/075* (2006.01)
(Continued)

(52) U.S. Cl.
CPC ............ *H01C 17/075* (2013.01); *H01C 1/142* (2013.01); *H01C 7/006* (2013.01); *H01C 17/006* (2013.01); *H01C 17/288* (2013.01)

(58) Field of Classification Search
CPC ........ H01C 17/075; H01C 1/142; H01C 7/006
(Continued)

(56) References Cited

U.S. PATENT DOCUMENTS 7,669,313 B2    3/2010  Fivas et al. .................. 29/610.1
7,829,428 B1 * 11/2010  Leng ....................... H01L 28/20
                                              257/E27.047
(Continued)

FOREIGN PATENT DOCUMENTS

CN          104051614 A     9/2014  ............. H01L 45/00

OTHER PUBLICATIONS

International Search Report and Written Opinion, Application No. PCT/US2019/037616, 11 pages, dated Aug. 21, 2019.

*Primary Examiner* — Kyung S Lee
*Assistant Examiner* — Iman Malakooti
(74) *Attorney, Agent, or Firm* — Slayden Grubert Beard PLLC

(57) ABSTRACT

A method for manufacturing a thin film resistor (TFR) module in an integrated circuit (IC) structure is provided. A TFR trench may be formed in an oxide layer. A resistive TFR layer may be deposited over the structure and extending into the trench. Portions of the TFR layer outside the trench may be removed by CMP to define a TFR element including a laterally-extending TFR bottom region and a plurality of TFR ridges extending upwardly from the laterally-extending TFR bottom region. At least one CMP may be performed to remove all or portions of the oxide layer and at least a partial height of the TFR ridges. A pair of spaced-apart metal interconnects may then be formed over opposing end regions of the TFR element, wherein each metal interconnect contacts a respective upwardly-extending TFR ridge, to thereby define a resistor between the metal interconnects via the TFR element.

19 Claims, 12 Drawing Sheets

(51) Int. Cl.
*H01C 7/00* (2006.01)
*H01C 17/28* (2006.01)
*H01C 17/00* (2006.01)
*H01C 1/142* (2006.01)

(58) Field of Classification Search
USPC .......................................................... 338/327
See application file for complete search history.

(56) References Cited

U.S. PATENT DOCUMENTS

| | | |
|---|---|---|
| 9,679,844 B2 | 6/2017 | Leng et al. |
| 2002/0197844 A1 | 12/2002 | Johnson et al. ............... 438/618 |
| 2005/0122207 A1* | 6/2005 | Vialpando .............. H01C 7/006 338/309 |
| 2009/0065898 A1 | 3/2009 | Chinthakindi et al. ........ 257/536 |
| 2013/0093024 A1* | 4/2013 | Eshun ..................... H01L 28/20 257/379 |

* cited by examiner

THIN-FILM RESISTOR (TFR) MODULE WITH TOP-SIDE INTERCONNECTS CONNECTED TO REDUCED TFR RIDGES AND MANUFACTURING METHODS

RELATED PATENT APPLICATION

This application claims priority to commonly owned U.S. Provisional Patent Application No. 62/688,132 filed Jun. 21, 2018, the entire contents of which are hereby incorporated by reference for all purposes.

TECHNICAL FIELD

The present disclosure relates to thin-film resistors (TFRs), in particular to damascene type TFR modules with top-side metal interconnects (e.g., aluminum interconnects), and methods of manufacturing such TFR modules.

BACKGROUND

Semiconductor integrated circuits (IC) typically include metallization layers used to connect various components of the IC, called interconnect, or back end of line (BEOL) elements. Copper often preferred over aluminum due to its lower resistivity and high electro-migration resistance. Copper interconnect, however, is typically difficult to manufacture with traditional photoresist masking and plasma etching used for aluminum interconnect.

One known technique for forming copper interconnects on an IC is known as additive patterning, sometimes called a damascene process, which refers to traditional metal inlaying techniques. A so-called damascene process may include patterning dielectric materials, such as silicon dioxide, or fluorosilicate glass (FSG), or organo-silicate glass (OSG) with open trenches where the copper or other metal conductors should be. A copper diffusion barrier layer (typically Ta, TaN, or a bi-layer of both) is deposited, followed by a deposited copper seed layer, followed by a bulk Copper fill, e.g., using an electro-chemical plating process. A chemical-mechanical planarization (CMP) process may then be used to remove any excessive copper and barrier, and may thus be referred to as a copper CMP process. The copper remaining in the trench functions as a conductor. A dielectric barrier layer, e.g., SiN or SiC, is then typically deposited over the wafer to prevent copper corrosion and improve device reliability.

With more features being packed into individual semiconductor chips, there is an increased need to pack passive components, such as resistors, into the circuits. Some resistors can be created through ion implantation and diffusion, such as poly resistors. However, such resistors typically have high variations in resistance value, and may also have resistance values that change drastically as a function of temperature. A new way to construct integrated resistors, called Thin-Film Resistors (TFRs) has been introduced in the industry to improve integrated resistor performance. Known TFRs are typically formed from SiCr (silicon-chromium), SiCCr (silicon-silicon carbide-chromium), TaN (tantalum nitride), NiCr (nickel-chromium), AlNiCr (aluminum-doped nickel-chromium), or TiNiCr (titanium-nickel-chromium), for example.

FIG. 1 shows a cross-sectional view of two example TFRs 10A and 10B devices implemented using conventional processes. Fabrication of conventional TFRs 10A and 10B devices typically requires three added mask layers. A first added mask layer is used to create the TFR heads 12A and 12B. A second added mask layer is used to create the TFRs 14A and 14B. A third added mask layer is used to create TFR vias 16A and 16B. As shown, TFRs 12A and 12B are formed across the top and bottom of TFR heads 12A and 12B, respectively, but in each case three added mask layers are typically required.

FIG. 2 shows a cross-sectional view of a known IC structure including an example TFR 30 formed in view of the teachings of U.S. Pat. No. 9,679,844, wherein TFR 30 can be created using a single added mask layer and damascene process. A TFR film 34, in this example a SiCCr film, may be deposited into trenches patterned into a previously processed semiconductor substrate. As shown, SiCCr film 34 is constructed as a resistor between conductive (e.g., copper) TFR heads 32, with an overlying dielectric region including a dielectric layer 36 (e.g., SiN or SiC) and a dielectric cap region 38 (e.g., SiO2) formed over the SiCCr film 34. The IC structure including TFR 30 may be further processed for a typical Cu (copper) interconnect process (BEOL), e.g., next level of via and trench. TFR 30 may be connected with other parts of the circuit using typical copper vias 40 connected to the copper TFR heads 32 for example.

Embodiments of TFR 30 may be particularly suitable for copper BEOL, which may have limitations regarding annealing (e.g., anneal temperature may be limited to about 200° C.). However, there is a need to construct TFR before metallization (either Cu or Al), so the TFR can be annealed at high temperature (e.g., around 500° C.) to achieve 0 ppm or near 0 ppm temperature coefficient of resistance (TCR). Also, there is a need or advantage (e.g., cost and time advantage) to reduce the number of mask layers required to construct the TFR. Further, there is a need for a TFR module formed using a damascene method for use in legacy technologies with aluminum interconnects, e.g., for high performance analog designs.

BRIEF DESCRIPTION OF THE DRAWINGS

Example aspects of the present disclosure are described below in conjunction with the figures, in which.

SUMMARY

Embodiments of the present disclosure provide thin-film resistor (TFR) modules with top-side metal interconnects/TFR heads, methods for manufacturing such TFR modules, and integrated circuit devices including such TFR modules. In some embodiments, TFR modules may be formed using a damascene CMP approach, e.g., in contrast to a wet or dry etch process. Some embodiments provide thin-film resistor (TFR) modules with top-side aluminum interconnects/TFR heads, e.g., working for back-end-of-line (BEOL) with aluminum interconnects.

Further, in some embodiments, TFR modules may be formed using a single added mask layer. For example, the TFR interconnects/heads may be defined by a metal layer (e.g., M1 layer) formed over, and thus after, the TFR element, which may eliminate one or two mask layers as compared the fabrication process for certain conventional TFR modules, which may reduce costs as compared with conventional fabrication processes. As the TFR element is formed before the TFR heads/contacts, the TFR film may be annealed without affecting the later-formed TFR head/contact structures, and thus may be formed from various materials with different annealing properties or requirements, including SiCCr and SiCr, for example. Thus, the TFR element may be annealed to achieve 0 ppm or near 0 ppm TCR, without affecting the later-formed TFR interconnects/heads.

In some embodiments, vertically-extending TFR element "ridges" at lateral edges of the TFR element may be removed or eliminated by a suitable ridge removal process, e.g., by a metal etch used to form the metal (e.g., aluminum) interconnects over the TFR element.

In some embodiments, vertically-extending TFR element "ridges" that may negatively affect the TCR (temperature coefficient of resistance) or other performance characteristic of the TFR module may be partially or fully reduced or eliminated during a metal etch that forms the TFR metal interconnects/heads (e.g., aluminum interconnects/heads). Removal of the TFR ridges may provide controlled or improved TCR performance, e.g., as discussed in co-pending U.S. Provisional Patent Application No. 62/670,880 filed May 14, 2018, the entire contents of which application are hereby incorporated by reference.

DETAILED DESCRIPTION

FIGS. 3A-3C through 13A-13C illustrate an example process for forming a TFR module according to one example embodiment.

Figure 1:
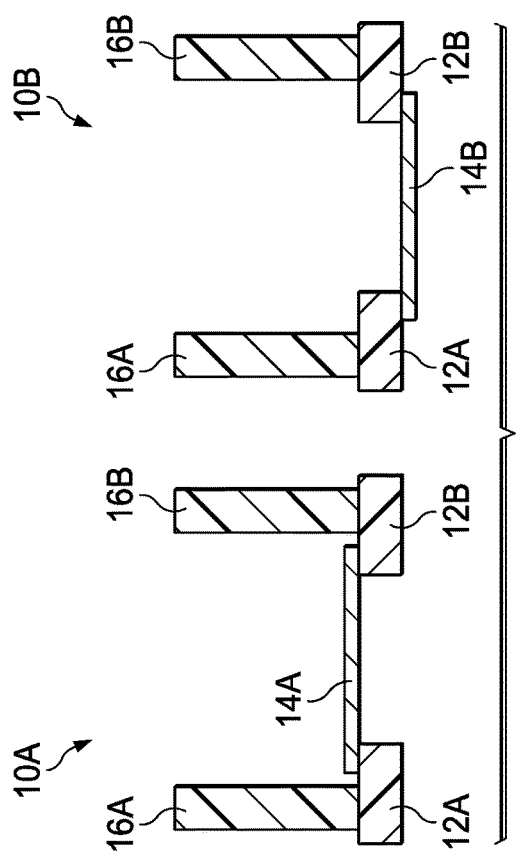
FIG. 1 is a cross-sectional view of two example thin-film resistor (TFR) devices implemented using known processes.
Figure 2:
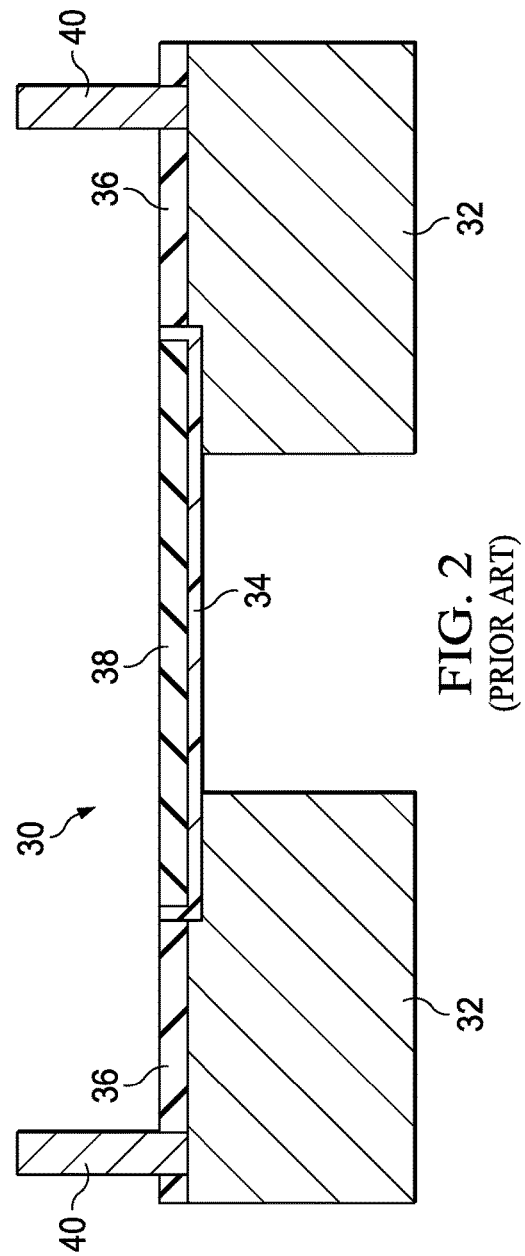
FIG. 2 is a cross-sectional view of a known integrated circuit (IC) structure including an example TFR formed according to known techniques.
Figure 3A:
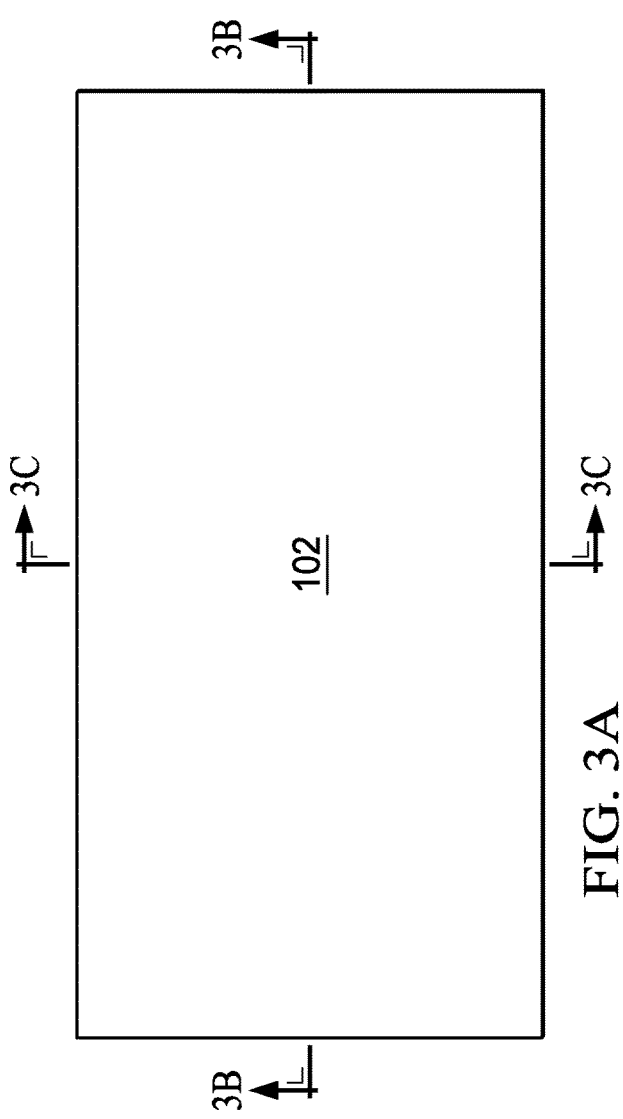
FIGS. 3A-3C through 13A-13C illustrate an example process for forming a TFR module according to one example embodiment.
Figure 3B:
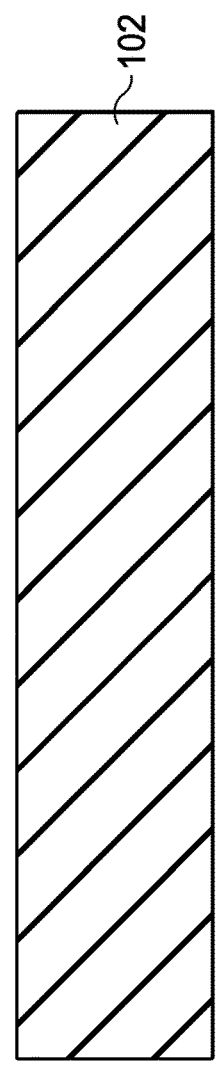
Figure 3C:
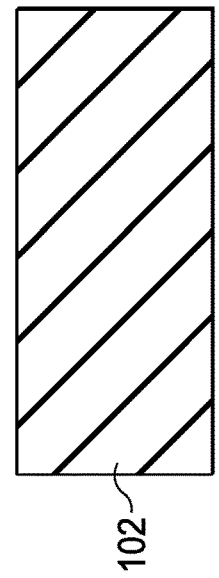

In some embodiments, the TFR module may be formed after a pre-metal dielectric (PMD) chemical mechanical planarization (CMP) process. FIGS. 3A-3C illustrate a top view (FIG. 3A), a cross-sectional side view (FIG. 3B), and a cross-sectional end view (FIG. 3C) of an initial structure 100 including a PMD region 102 after PMD CMP. In some embodiments, PMD 102 may comprises a dielectric layer, e.g., HDP (High Density Plasma) oxide, formed over a substrate.

Figure 4A:
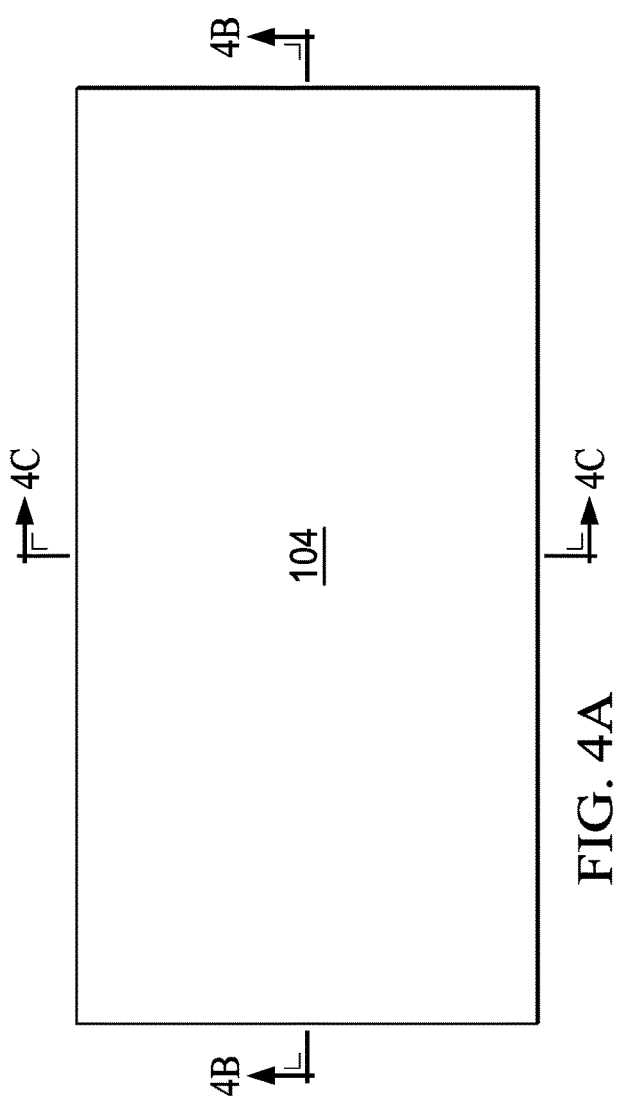
Figure 4B:
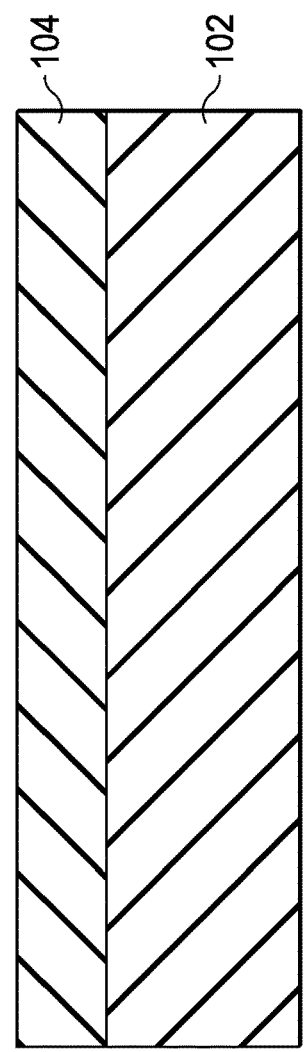
Figure 4C:
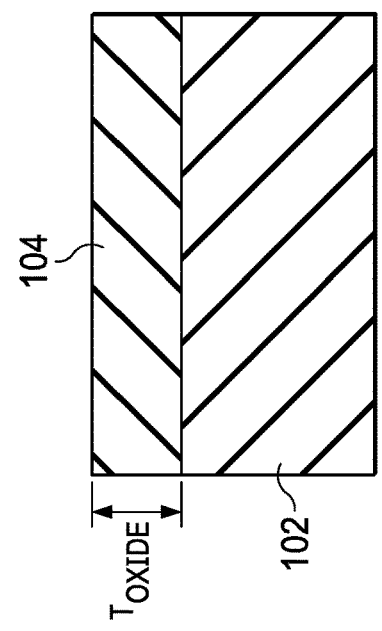

As shown in FIGS. 4A-4C, an oxide layer 104, e.g., having a thickness $T_{oxide}$ of about 1000 Å (e.g., 500 Å-1500 Å) may be deposited over PMD 102.

Figure 5A:
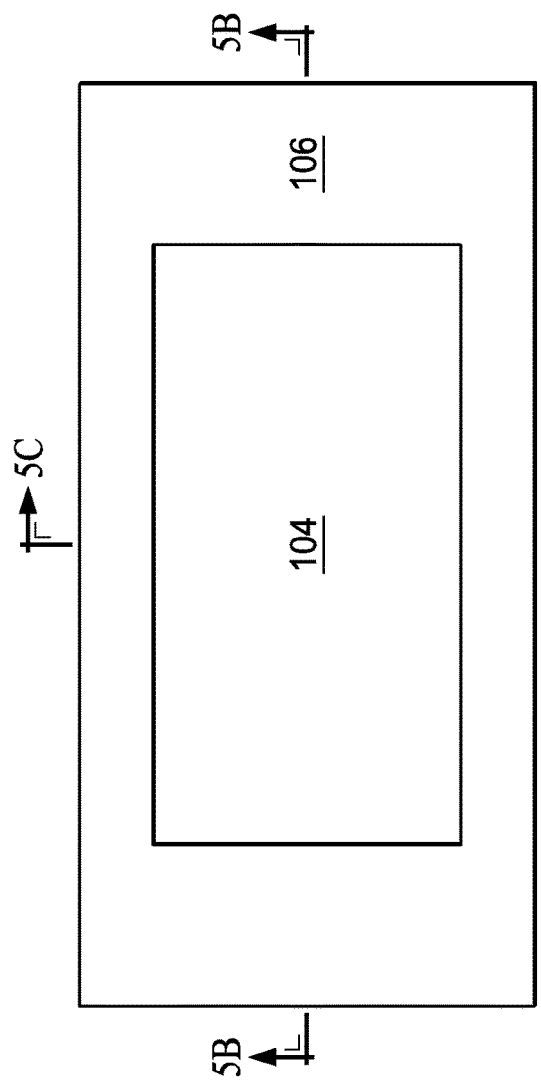
Figure 5B:
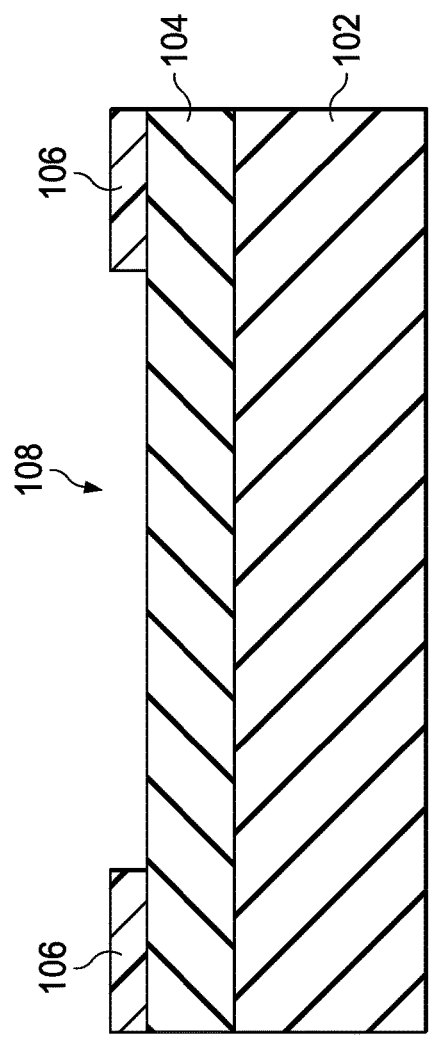
Figure 5C:
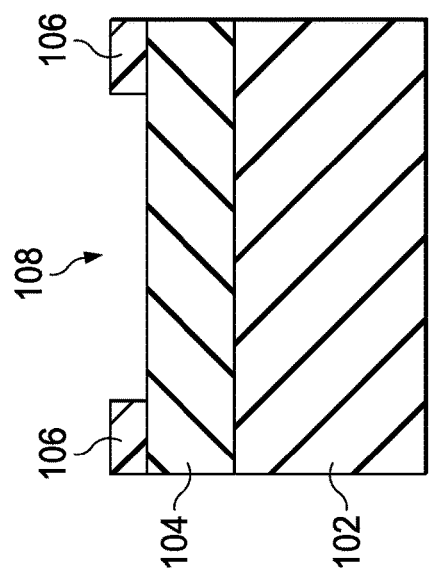

As shown in FIGS. 5A-5C, a photoresist 108 may be deposited and patterned to define an opening 108 for forming a TFR trench.

Figure 6A:
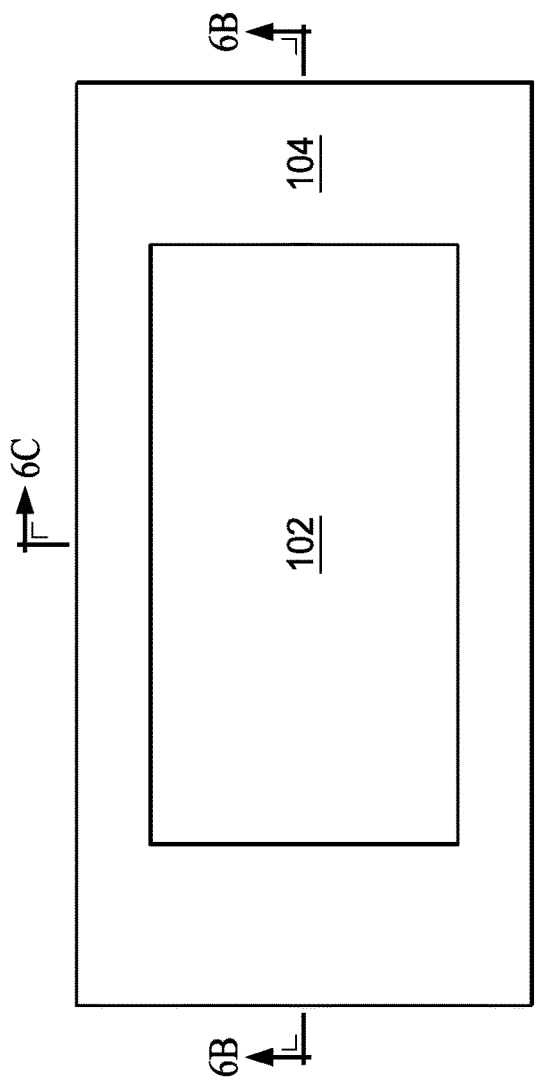
Figure 6B:
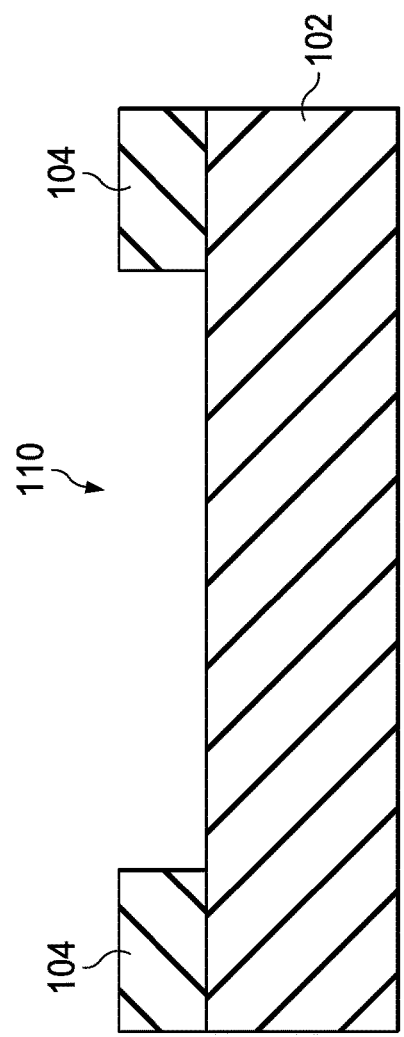
Figure 6C:
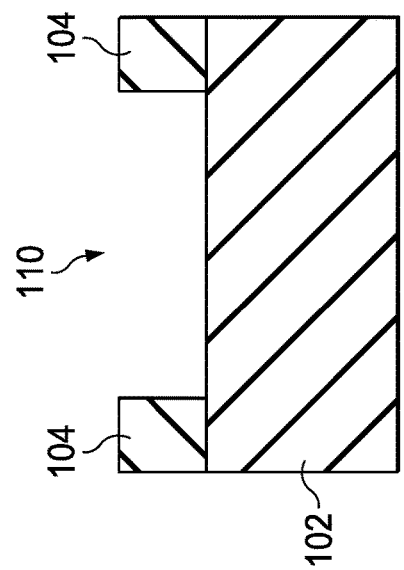

As shown in FIGS. 6A-6C, a TFR trench etch may be performed to remove the exposed area of oxide layer 104 to define a TFR trench 110. The etch may be performed to stop on or slightly into the dielectric layer 102, and may thus define a TFR trench depth of about 1000 Å (e.g., 500 Å-1500 Å). Photo resist 106 may be stripped after the etch.

Figure 7A:
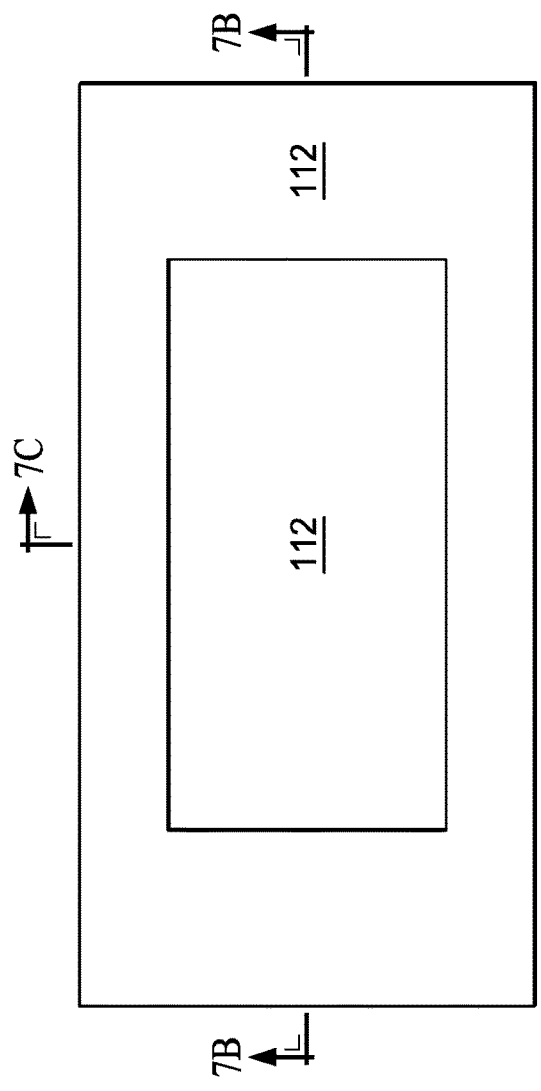
Figure 7B:
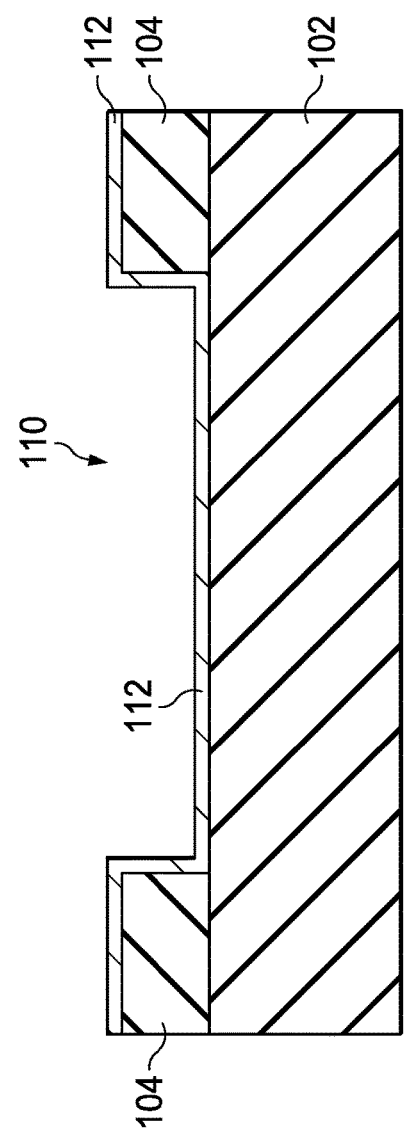
Figure 7C:
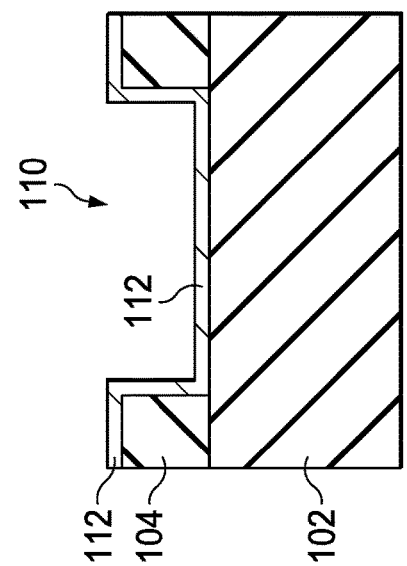

As shown in FIGS. 7A-7C, a layer of TFR material 112 may be deposited over the structure and extending into the TFR trench 110, e.g., using a PVD or sputter deposition process. In one embodiment, TFR layer 112 may comprise a SiCr or SiCCr layer with a thickness of about 100 Å-500 Å. In other embodiments, TFR layer 112 may comprise TaN, NiCr, AlNiCr, TiNiCr, or any other suitable TFR material. In some embodiments, the TFR layer thickness may be selected based on a target sheet resistance, e.g., 500-1000 Ω/sq. TFR layer 112 may be referred to as a resistive TFR layer.

In some embodiments, the structure may then be annealed, e.g., at a temperature of about 500° C. (e.g., 400° C.-600° C. or 450° C.-550° C.) for about 30 minutes (e.g., 20-60 min) to achieve 0 ppm or near 0 ppm TCR (temperature coefficient of resistance) of the TFR layer 110 or the resulting TFR module. In some embodiments, "near 0" ppm TCR may include a TCR of 0±400 ppm/° C., or a TCR of 0±100 ppm/° C., or a TCR of 0±50 ppm/° C., or a TCR of 0±20 ppm/° C., or a TCR of 0±10 ppm/° C., depending on the particular embodiment. In some particular embodiments, TFR layer 110 or the resulting TFR module may have a TCR of about 40 ppm/° C., e.g., 40±30 ppm/° C., or 40±20 ppm/° C., or 40±10 ppm/° C., e.g., according to techniques disclosed in co-pending U.S. Provisional Patent Application No. 62/670,880 filed May 14, 2018 (see, e.g., FIG. 10B and corresponding text), the entire contents of which application are hereby incorporated by reference.

Figure 8A:
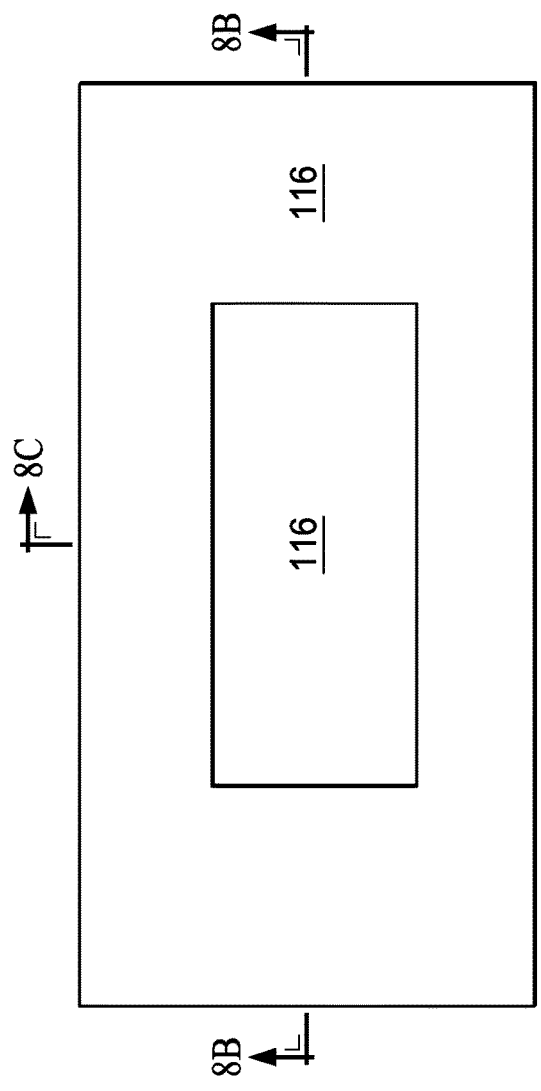
Figure 8B:
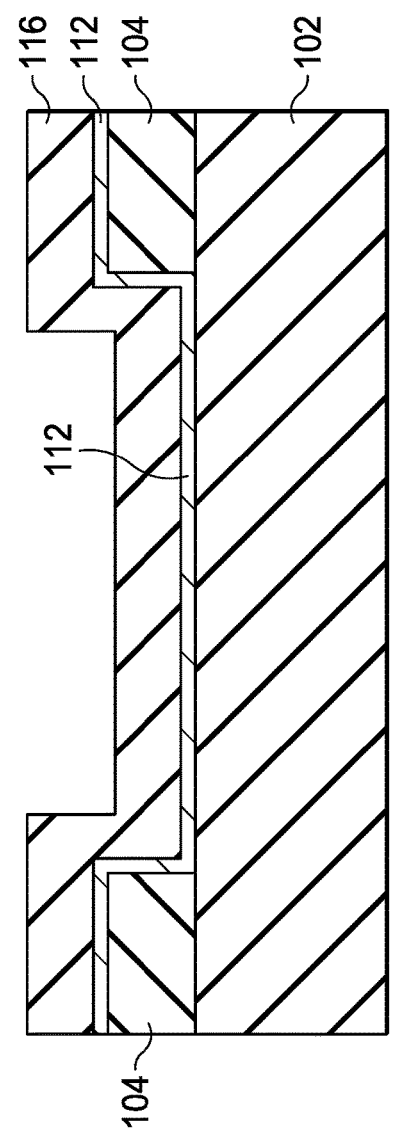
Figure 8C:
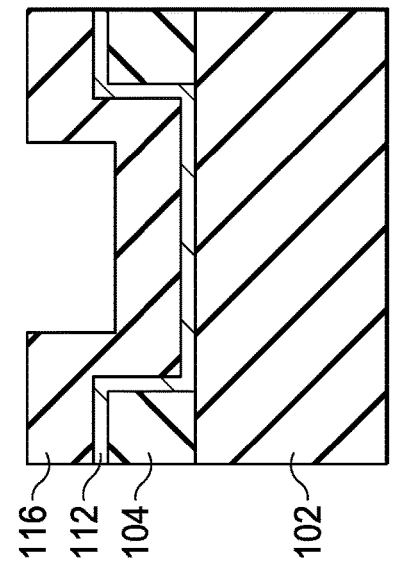

As shown in FIGS. 8A-8C, a dielectric cap layer 116 may be deposited over the structure and extending into the TFR trench 110, to protect TFR film 112. In one embodiment, dielectric cap layer 116 may comprise a nitride layer, e.g., silicon nitride, e.g., $Si_3N_4$ with a thickness of about 1000 Å (e.g., 500 Å-1500 Å).

Figure 9A:
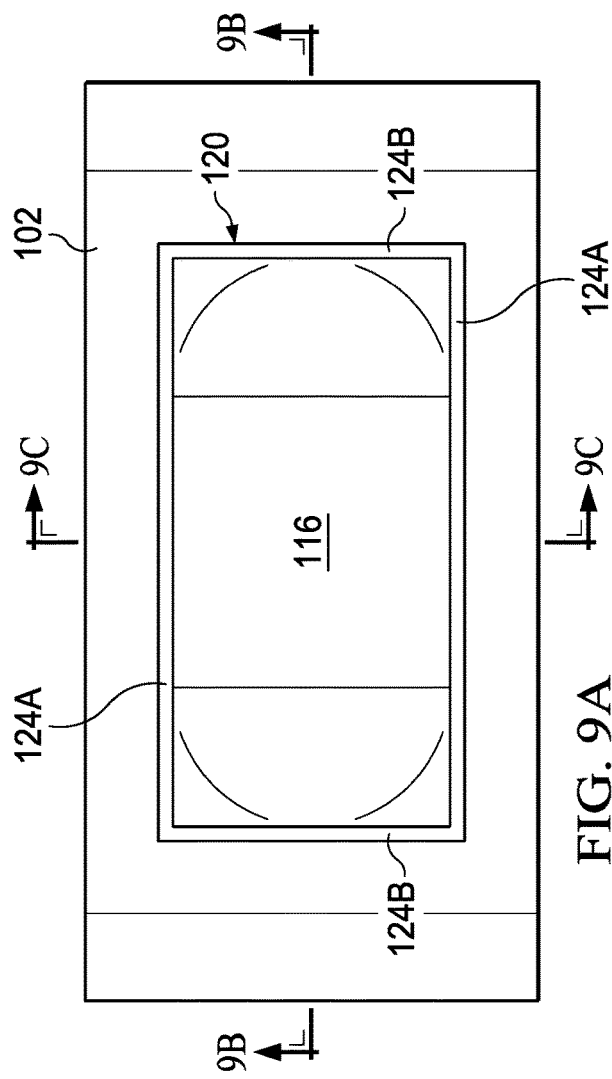
Figure 9B:
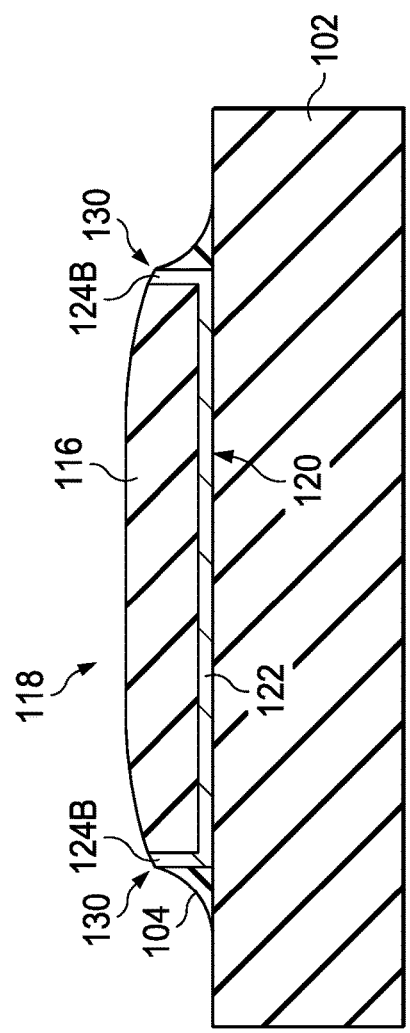
Figure 9C:
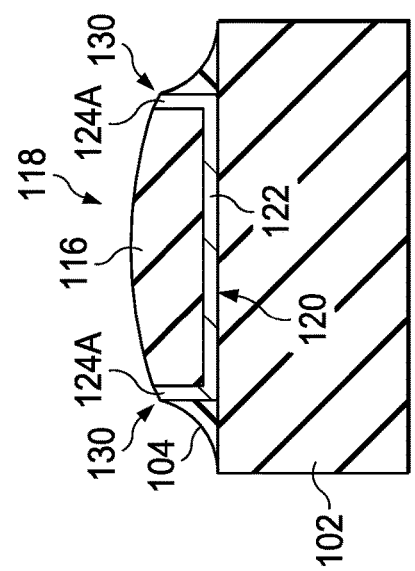

As shown in FIGS. 9A-9C, a TFR CMP may be performed to remove the upper portions (i.e., outside the TFR trench) of TFR layer 112 and dielectric cap layer 116 to define a TFR element 122 having a laterally-extending bottom region 122 and a vertically-extending ridge 124 extending upwardly around the circumference of bottom region 122. In the illustrated example, in which dielectric cap layer 116 comprises nitride (e.g., silicon nitride), the nitride/oxide selectivity of the CMP process (e.g., removing oxide layer 104 faster than nitride cap layer 116) may define a mound shaped structure 118 over the TFR element 122. As shown in FIGS. 9A-9C, the circumferential TFR ridge 124 includes a pair of longer ridges 124A extending from the longer sides of TFR element 122 and a pair of shorter ridges 124B extending from the shorter sides of TFR element 122.

As shown, the mound-shaped structure 118 may define tapered regions adjacent each TFR ridge 124, with each tapered region having a sloping, curved top surface that may define a corner or bend at the location of each TFR ridge, as indicated at 130. The shape of mound-shaped structure 118, including the sloping regions adjacent each TFR ridge 124, and the corners or bends 130 at such sloping regions, may be defined by the specific nitride/oxide selectivity of the CMP.

Figure 10A:
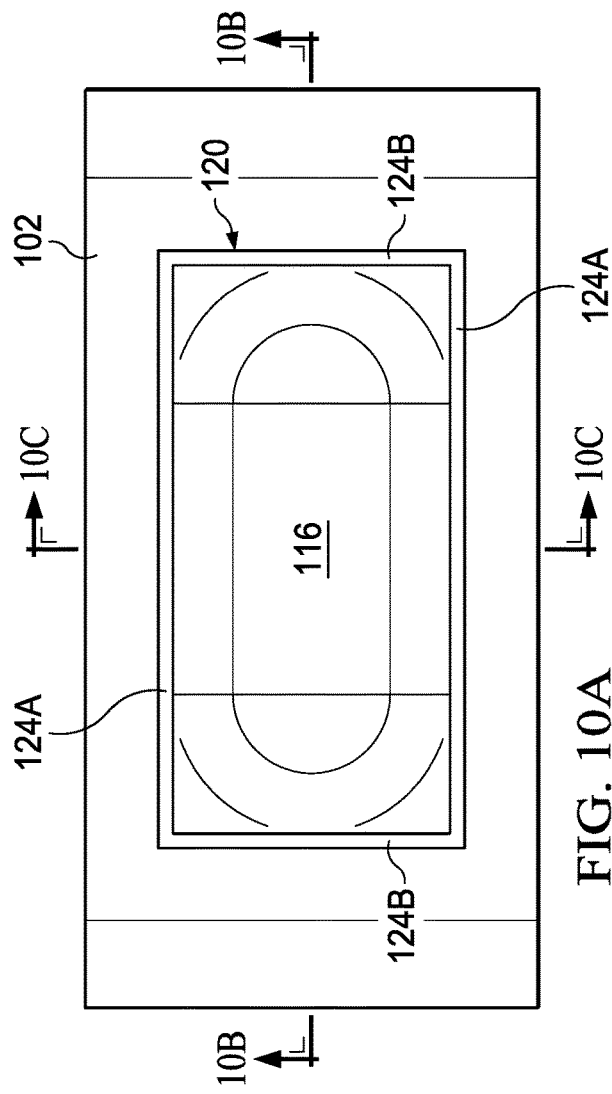
Figure 10B:
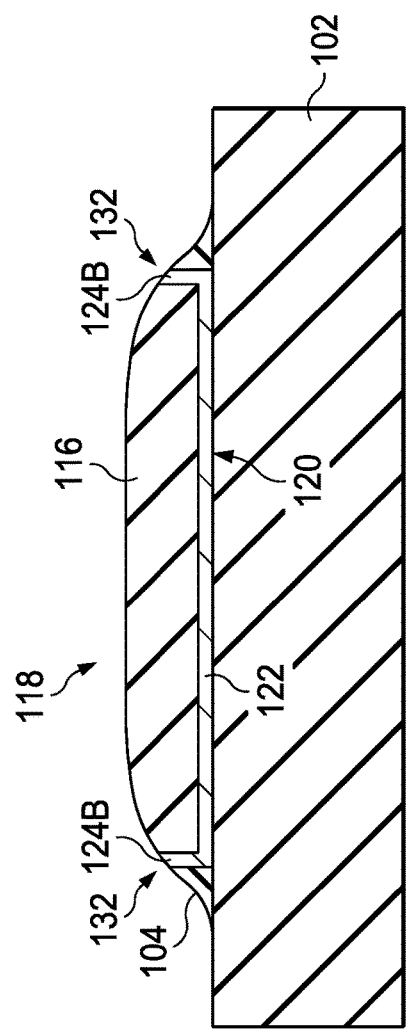
Figure 10C:
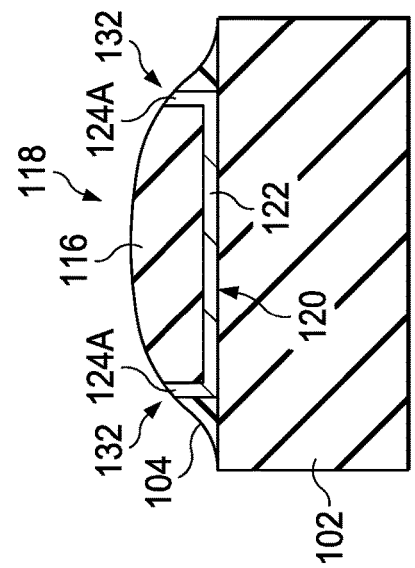
Figure 13A:
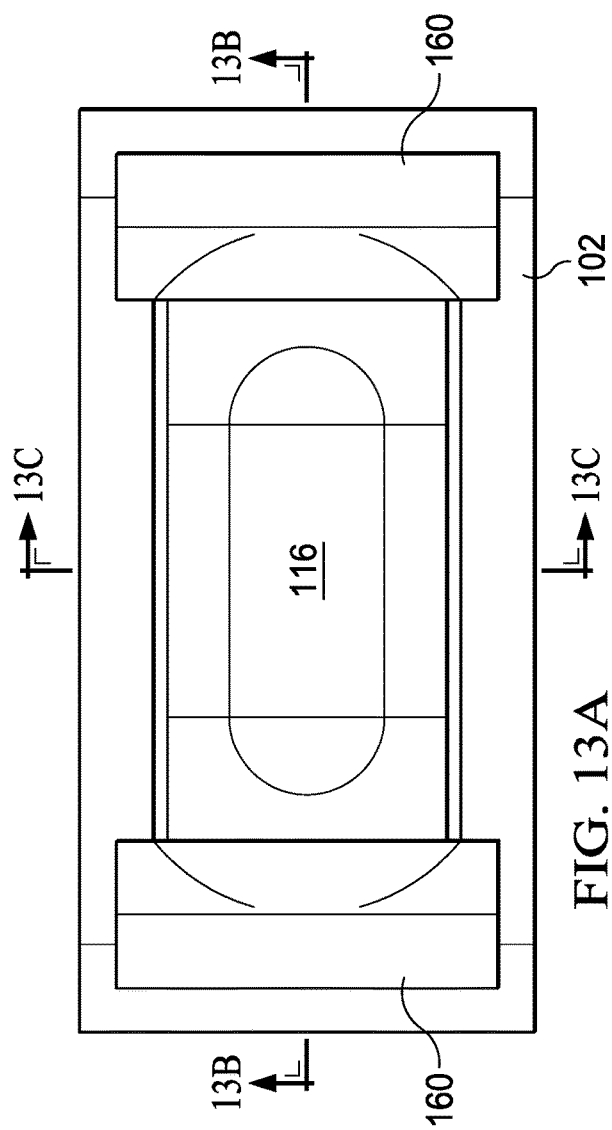
Figure 13B:
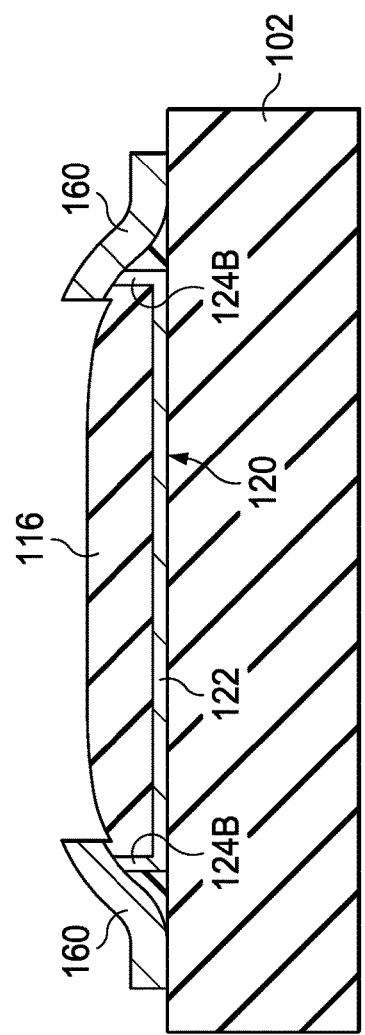
Figure 13C:
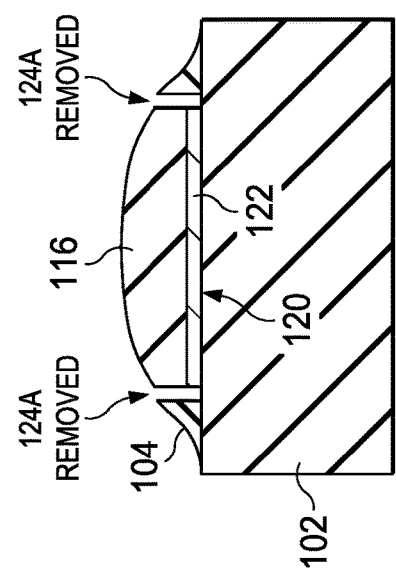

As shown in FIGS. 10A-10C, in some embodiments, the top surface of mound shaped structure 118 may be further tapered and smoothed using any suitable process(es), e.g., which may further reduce the height of TFR ridges 124 and/or facilitate a subsequent metal etch to remove a remaining height of one or more TFR ridges 124 (e.g., portions of the long TFR ridges 124A uncovered by the post-etch metal interconnects, as shown in FIG. 13C discussed below). In one embodiment, the process for tapering and smoothing the mound profile and reducing the height of TFR ridges 124 may include a contact pattern and etch, Ti or TiN liner deposition, a tungsten layer deposition, and a tungsten CMP, which are common process-of-record steps for forming device contacts in a typical integrated circuit (IC) process flow. The tungsten CMP may reduce the TFR ridge height and/or further taper and smooth the top surface at the sloped region adjacent each TFR ridge 124. The processing described above may reduce the corners or bends 130 in the top surface of the mound structure 118, to thereby produce a smooth top surface 132 in the area of TFR ridges 124, which may improve the structural quality of metal interconnects/heads 160 (discussed below) subsequently formed over TFR ridges 124.

Figure 11A:
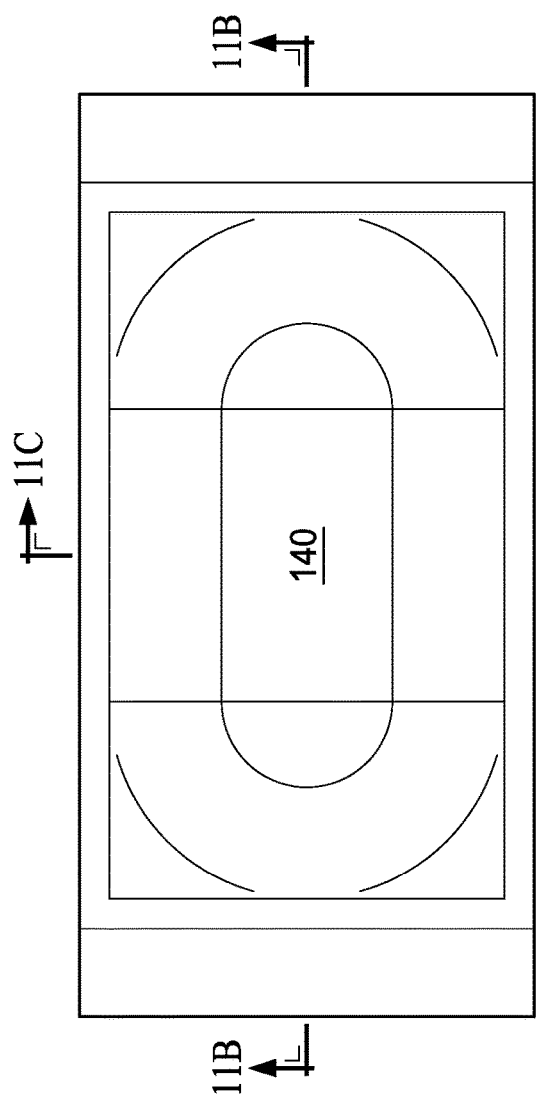
Figure 11B:
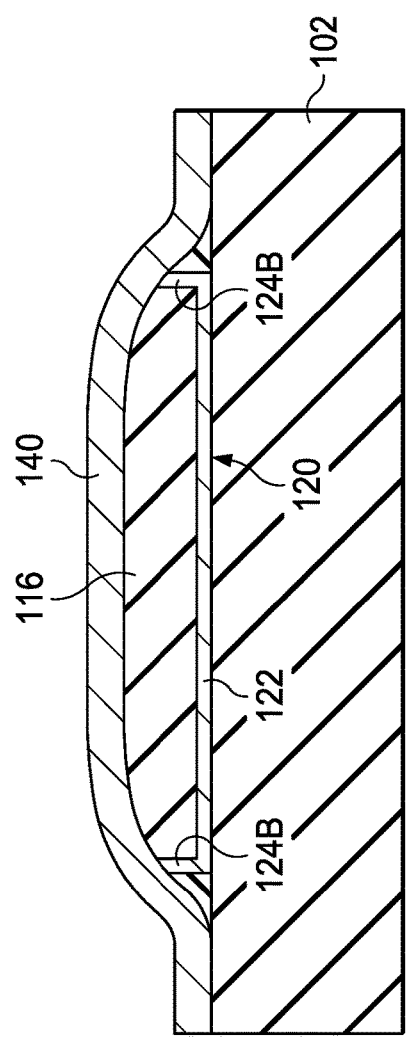
Figure 11C:
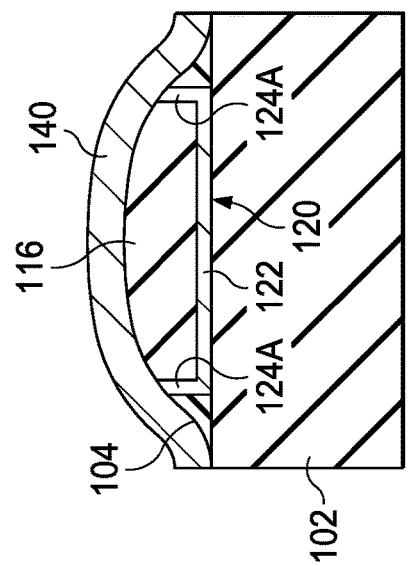

As shown in FIGS. 11A-11C, a metal layer (e.g., metal 1 layer) 140 may be deposited over the structure. In some embodiments, metal layer 140 may comprise aluminum. In other embodiments, metal layer 140 may comprise copper or other metal(s). As shown, the deposited metal layer 140 defines downwardly sloping (non-vertical and non-horizontal) regions extending over the circumference of TFR element 122 and contacting the top surfaces of TFR ridges 124A and 124B.

Figure 12A:
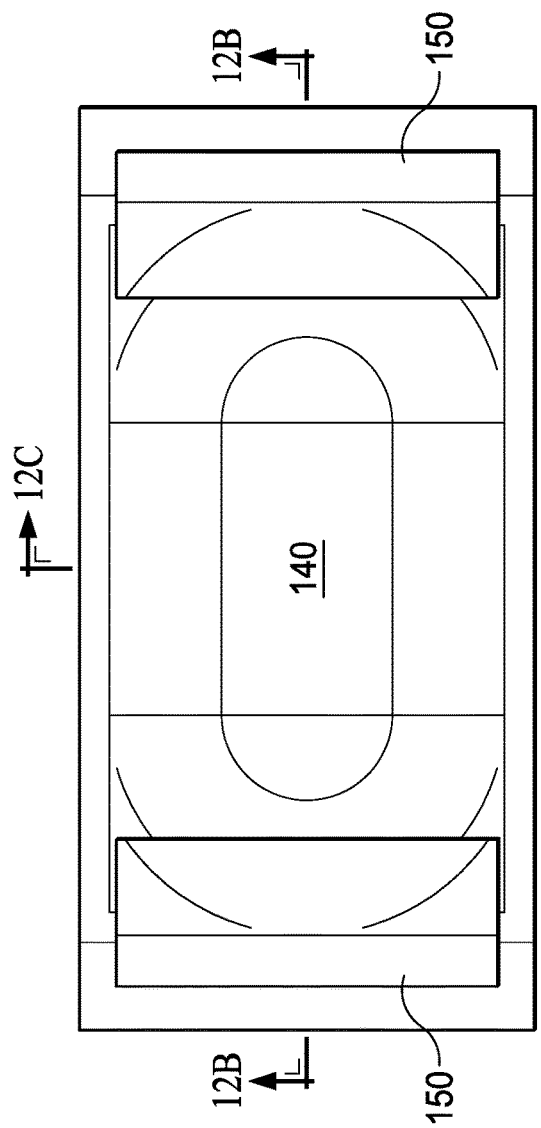
Figure 12B:
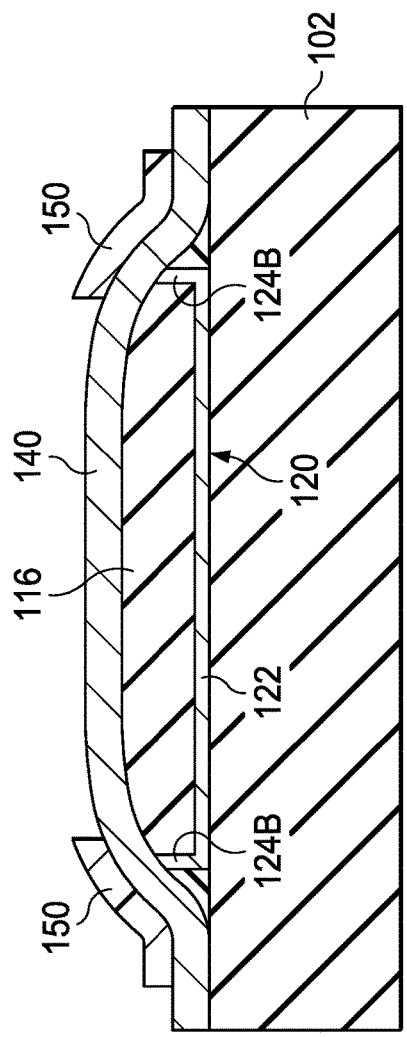
Figure 12C:
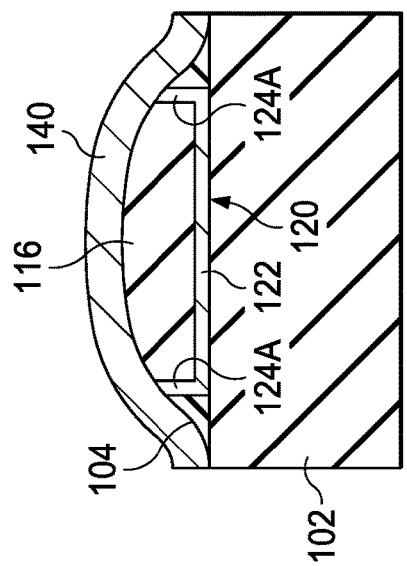

As shown in FIGS. 12A-12C, photoresist 150 is deposited over metal layer 140 and patterned to define a pair of resist regions 150 over the short TFR ridges 124B at opposing ends of TFR element 112. In some embodiments, this patterning step may be the process-of-record metal 1 patterning step in a typical integrated circuit (IC) process flow with Al interconnects.

As shown in FIGS. 13A-13C, a metal etch is performed to define a pair of metal interconnects or TFR heads 160. A bottom surface of each interconnect 160 contacts a top surface of a respective TFR ridge 124B, to thereby provide a conductive path between the two interconnects 160 via TFR element 122. The metal etch may also remove the remaining portions of long TFR ridges 124A that are not covered by photoresist 150/interconnects 160, as indicated in FIG. 13C.

As discussed above, reduction or removal or one or more TFR element ridges 124 may improve the temperature coefficient of resistance (TCR) performance of the TFR module during operation.

Further, in some embodiments of the invention, the TFR module can be constructed underneath other level(s) of metal layer, e.g., comprising Al interconnects, such as metal-2, metal-3, etc. and is thus not limited to the metal-1 example discussed above. In some embodiments, the TFR module can be inserted after an Inter-Level Dielectrics (ILD) CMP to planarize the topography from a previous metal layer in the Al interconnects.

The invention claimed is:

1. A method for manufacturing a thin film resistor (TFR) module in an integrated circuit (IC) structure, the method comprising:
    forming a trench in an integrated circuit structure;
    depositing a resistive TFR layer over the integrated circuit structure and extending into the trench;
    removing portions of the TFR layer outside the trench to define a TFR element including a laterally-extending TFR bottom region and a plurality of TFR ridges extending upwardly from the laterally-extending TFR bottom region;
    performing at least one material removal process to remove at least a partial height of the TFR ridges; and
    forming a pair of spaced-apart metal interconnects over opposing end regions of the TFR element by a process including:
        depositing a metal layer over the TFR element; and
        performing a metal etch to remove portions of the metal layer to thereby define the pair of spaced-apart metal interconnects, wherein the metal etch also removes at least a partial height of at least one TFR ridge uncovered by the metal interconnects,
    wherein each metal interconnect contacts a respective upwardly-extending TFR ridge, to thereby define a conductive path between the metal interconnects via the TFR element.

2. The method of claim 1, wherein the at least one material removal process forms a mound-shaped structure including the TFR element; and
    wherein forming the pair of spaced-apart metal interconnects comprises forming the pair of metal interconnects on sloping upper surfaces of the mound-shaped structure.

3. The method of claim 1, wherein the spaced-apart metal interconnects comprise aluminum.

4. The method of claim 1, wherein the spaced-apart metal interconnects are formed in a metal 1 layer.

5. The method of claim 1, wherein the TFR layer comprises SiCr or SiCCr.

6. The method of claim 1, further comprising:
    prior to removing portions of the TFR layer outside the trench, depositing a nitride cap layer over the TFR layer and extending into the trench; and
    wherein the step of removing portions of the TFR layer outside the trench to define the TFR element also removes portions of the nitride cap layer outside the trench.

7. The method of claim 1, further comprising, prior to forming the metal interconnects, annealing the TFR layer or TFR element to provide a selected temperature coefficient of resistance (TCR).

8. The method of claim 1, wherein forming a trench in an integrated circuit structure comprises:
    forming an oxide layer over a dielectric region; and
    forming a trench in the oxide layer.

9. The method of claim 1, wherein the material removal process comprises a chemical mechanical planarization (CMP).

10. The method of claim 1, wherein removing portions of the TFR layer outside the trench to define the TFR element comprises performing a chemical mechanical planarization (CMP).

11. A thin film resistor (TFR), comprising:
    a resistive TFR element including a laterally-extending TFR bottom region and a pair of TFR ridges extending upwardly from first and second lateral sides of the laterally-extending TFR bottom region;
    a non-conductive structure adjacent each upwardly-extending TFR ridge, each non-conductive structure defining a sloping top surface that slopes downwardly in a direction away from a center of the TFR element, the sloping top surface being non-parallel and non-perpendicular with respect to the laterally-extending TFR bottom region;
    a pair of metal interconnects formed over the TFR element, wherein each metal interconnect:
        is positioned over a respective non-conductive structure adjacent a respective upwardly-extending TFR ridge;
        extends obliquely over the sloping top surface of the respective non-conductive structure, such that each metal interconnect extends non-parallel and non-perpendicular with respect to the laterally-extending TFR bottom region; and
        contacts the respective upwardly-extending TFR ridge;
    such that a conductive path is defined between the metal interconnects via the upwardly-extending TFR ridges and the laterally-extending TFR bottom region.

12. The thin film resistor of claim 11, wherein the metal interconnects comprise aluminum.

13. The thin film resistor of claim 11, wherein the TFR element comprises a damascene-type element formed in a trench.

14. The thin film resistor of claim 11, wherein the metal interconnects are formed in a metal 1 layer.

15. The thin film resistor of claim 11, wherein the TFR element comprises SiCr or SiCCr.

16. The thin film resistor of claim 11, wherein the non-conductive structure adjacent each upwardly-extending TFR ridge comprises a nitride region located laterally between the pair of upwardly-extending TFR ridges and over the laterally-extending TFR bottom region.

17. The thin film resistor of claim 11, wherein the non-conductive structure adjacent each upwardly-extending TFR ridge comprises an oxide region on a first side of the respective upwardly-extending TFR ridge and a nitride region on a second side of the respective upwardly-extending TFR ridge.

18. A method for manufacturing a thin film resistor (TFR) module in an integrated circuit (IC) structure, the method comprising:
 forming a trench in an integrated circuit structure;
 depositing a resistive TFR layer over the integrated circuit structure and extending into the trench;
 depositing a nitride cap layer over the TFR layer, the nitride layer extending downwardly into the trench to cover a portion of the TFR layer in the trench and also extending outside the trench to cover portions of the TFR layer outside the trench;
 removing the portions of the nitride cap layer outside the trench and the portions of the TFR layer outside the trench to define a TFR element including a laterally-extending TFR bottom region and a plurality of TFR ridges extending upwardly from the laterally-extending TFR bottom region;
 performing at least one material removal process to remove at least a partial height of the TFR ridges; and
 forming a pair of spaced-apart metal interconnects over opposing end regions of the TFR element, wherein each metal interconnect contacts a respective upwardly-extending TFR ridge, to thereby define a conductive path between the metal interconnects via the TFR element.

19. The method of claim 18, wherein the removing step leaves at least a partial thickness of the portion of the nitride layer in the trench covering the portion of the TFR layer in the trench.

* * * * *